United States Patent [19]
Satoh et al.

[11] Patent Number: 5,189,509
[45] Date of Patent: Feb. 23, 1993

[54] SEMICONDUCTOR DEVICE AND ELECTRODE BLOCK FOR THE SAME

[75] Inventors: Katsumi Satoh; Futoshi Tokunoh, both of Fukuoka, Japan

[73] Assignee: Mitsubishi Denki Kabushiki Kaisha, Tokyo, Japan

[21] Appl. No.: 621,967

[22] Filed: Dec. 4, 1990

[30] Foreign Application Priority Data

Dec. 15, 1989 [JP]  Japan ............... 1-326662

[51] Int. Cl.⁵ ................. H01L 23/02; H01L 23/04
[52] U.S. Cl. ................... 257/718; 257/727; 257/730; 257/719
[58] Field of Search ................... 357/79, 81

[56] References Cited

U.S. PATENT DOCUMENTS

| | | | |
|---|---|---|---|
| 3,457,472 | 7/1969 | Mulski | 357/79 |
| 3,512,249 | 5/1970 | Lewis | 357/79 |
| 4,426,659 | 1/1984 | de Bruyn et al. | 357/79 |
| 4,500,907 | 2/1985 | Takigami et al. | 357/79 |

FOREIGN PATENT DOCUMENTS

| | | |
|---|---|---|
| 0194946 | 9/1986 | European Pat. Off. |
| 2157923 | 8/1973 | France |
| 58-21347 | 2/1983 | Japan |
| 58-101433 | 6/1983 | Japan |
| 61-59742 | 4/1986 | Japan |
| 61-251043 | 11/1986 | Japan |

Primary Examiner—Eugene R. LaRoche
Assistant Examiner—Viet Q. Nguyen
Attorney, Agent, or Firm—Oblon, Spivak, McClelland, Maier & Neustadt

[57] ABSTRACT

A flat-pack type GTO thyristor (100) has an external cathode electrode (30) placed on a semiconductor element (1). The top surface of the external cathode electrode has a three-level step configuration (33a, 33b, 33c). When a cathode member (51) of an external electric equipment is pushed onto the external cathode electrode, no force is applied to the lower two steps (33b, 33c) in the step configuration. Consequently, the peripheral portion of the external cathode electrode is not deformed and the semiconductor element does not become unstable in gate characteristics.

12 Claims, 7 Drawing Sheets

SEMICONDUCTOR DEVICE AND ELECTRODE BLOCK FOR THE SAME

BACKGROUND OF THE INVENTION

1. Field of the Invention

The present invention relates to a pressure contact type semiconductor device and an electrode block usable in the same, and more particularly, it relates to an improvement for unifying a pressure distribution between an external electrode and a semiconductor substrate.

2. Description of the Prior Art

In a pressure contact type semiconductor device having a control electrode, an electrical contact of a semiconductor element with a control electrode conductor is kept by an elastic force of a spring, while external pressure is applied between an anode conductor and a cathode conductor provided in upper and lower portions of the semiconductor element.

Figure 9:
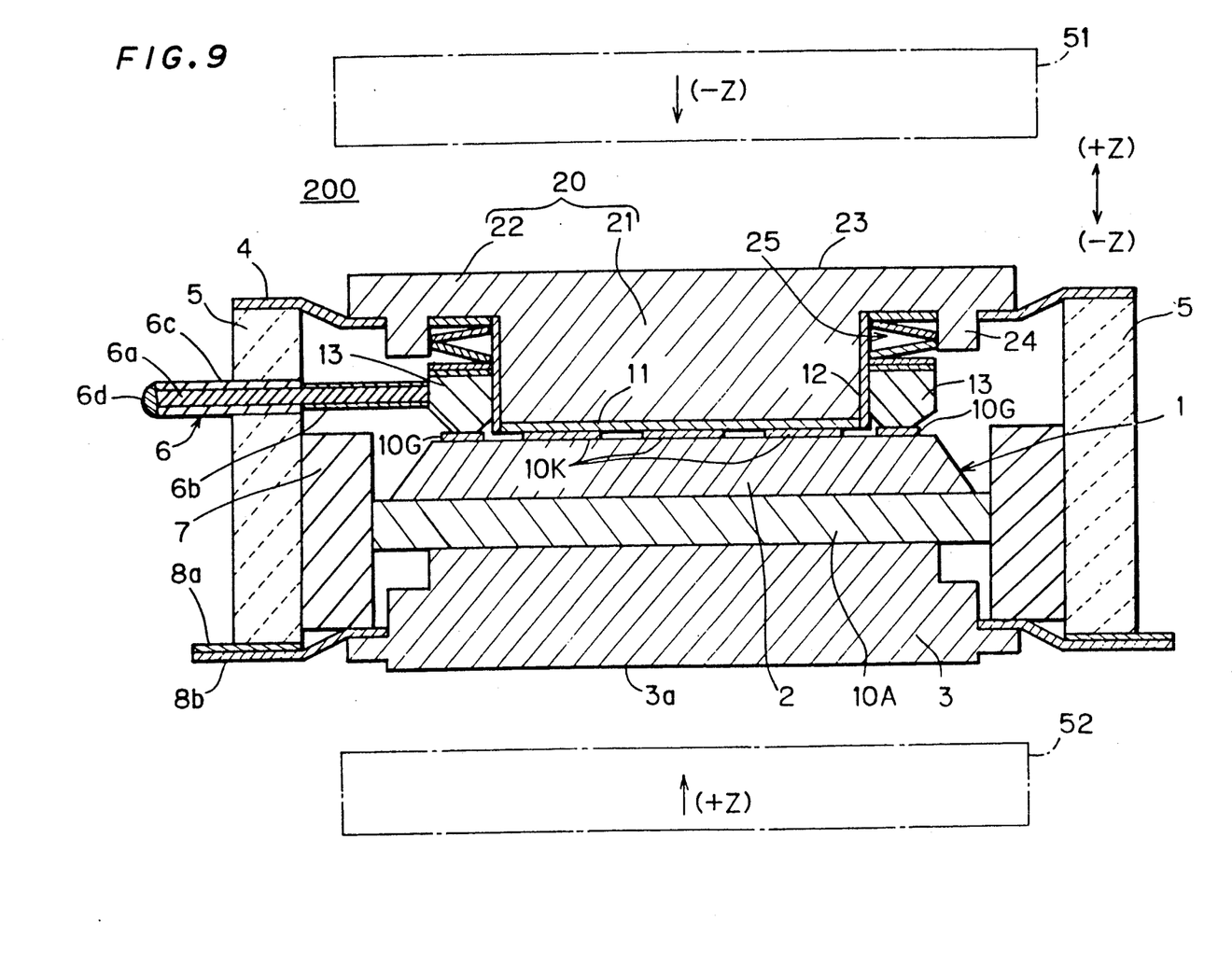
FIG. 9 is a sectional view of a conventional semiconductor device.

FIG. 9 is a sectional view showing a conventional pressure contact type gate turn-off thyristor (GTO). The flat pack type GTO 200 includes a semiconductor substrate 2, and the semiconductor substrate 2, has a pnpn 4-layer structure (not shown). On the top major surface of the semiconductor substrate 2, a cathode electrode 10K and a gate electrode 10G made of aluminum are selectively formed. The cathode electrode 10K is positioned in the center portion of the upper major surface, while the gate electrode 10G is positioned around the same. On the bottom major surface of the semiconductor substrate 2, an anode electrode 10A made of molybdenum and functioning also as a temperature compensating plate is brazed. Thus, a semiconductor element 1 is composed of the substrate 2 and the electrodes 10K, 10G and 10A.

The anode electrode 10A is fitted into a guide ring 7, and this keeps the semiconductor element 1 in position. In lower portion of the anode electrode 10A an external anode electrode 3 made of copper is disposed, while in an outer circumference of the external anode electrode 3 a flange 8b made of covar is brazed. Onto a lower lip of an insulating cylinder 5 made of ceramic another flange 8a is attached. The flanges 8a and 8b are brazed to each other to connect the insulating cylinder 5 with the external anode electrode 3. The insulating cylinder 5 is fitted on a guide ring 7.

On the other hand, in upper portion of the semiconductor element 1, an external cathode electrode 20 made of copper is disposed. The external cathode electrode 20 has a convex portion 21 in the center part of its bottom surface, and the convex portion 21 is united with a circumferential portion 22. In an area of the circumferential portion 22 adjacent to the convex portion 21, an annular groove (concave portion) 25 is formed. The convex portion 21 is in electrical contact with the cathode electrode 10K through the temperature compensating plate 11. The groove 25 is so positioned as to face the gate electrode 10G.

On the gate electrode 10G, an annular gate conductor 13 made of metal is disposed. The gate conductor 13 is electrically isolated from the external cathode electrode 20 by an insulating sheet 12.

Figure 10:
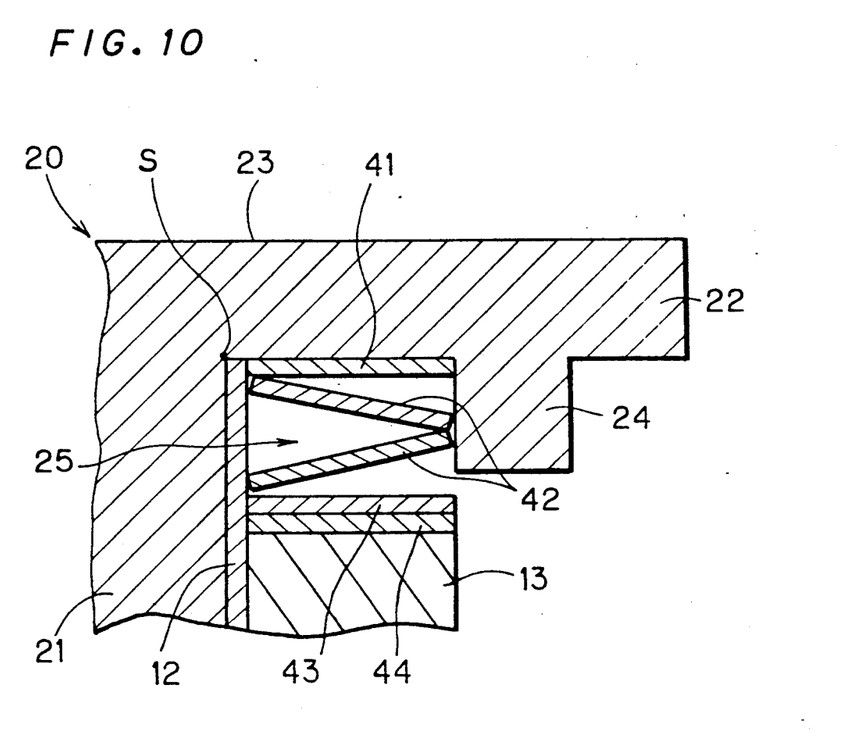
FIG. 10 is a partial enlarged view of a semiconductor device in FIG. 9.

As shown in a partial enlarged view of FIG. 10, an insulating ring 44 and a flat washer 43 are disposed on the upper surface of the gate conductor 13. Another flat washer 41 is placed on the ceiling face of the groove 25, and a pair of conical springs 42 intervening between the flat washers 41 and 43 permit the gate conductor 13 to be in pressure contact with the gate electrode 10G (FIG. 9).

Referring back to FIG. 9, one end of a gate lead 6a made of silver is brazed to the gate conductor 13. The gate lead 6a is held in an insulating sleeve 6b and extends outwords from an insulating cylinder 5 through a bore formed in the wall of the insulating cylinder 5. The gate lead 6a is inserted into a tube 6c made of metal and welded to the tube 6c at its tip 6d. In this way, a gate electrode 6 is formed.

A flange 4 is attached to an outer circumference of the external cathode electrode 20, and the flange 4 is brazed to an upper lip of the insulating cylinder 5 to connect the external cathode electrode 20 with the insulating cylinder 5.

When the GTO 200 having the structure as stated above is employed in an electric equipment, the GTO 200 should be positioned between an anode member 51 and a cathode member 52 of the equipment. The anode and cathode members 51 and 52 are pressed in a ($-Z$) direction and a ($+Z$) direction by springs, respectively, so that the bottom surface of the anode member 51 is in press contact with an upper surface 23 of the external cathode electrode 20 while the upper surface of the anode member 52 is in press contact with a bottom surface 3a of the external anode electrode 3. The pressure force keeps the external cathode electrode 20 in electrical contact with the cathode electrode 10K through the temperature compensating board 11 and also keeps the external anode electrode 3 in electrical contact with the anode electrode 10A. Under such conditions, voltage is applied between the cathode member 51 and the anode member 52, and a gate signal is applied to the external gate electrode 6 so as to turn on or off the GTO 200.

The external cathode electrode 20 and the external anode electrode 3 are so called stamp electrodes or post electrodes, and the surfaces 23 and 3a are post electrode faces.

In the above-mentioned GTO 200, to attain low values of a contact resistance between the cathode electrode 10K and the external cathode electrode 20 through the temperature compensating plate 11 and of a contact resistance between the anode electrode 10A and the external anode electrode 3, it is necessary to apply external force of approximately several tens kg/cm$^2$ to several hundreds kg/cm$^2$ uniformly to both the post electrode faces 23 and 3a. For the purpose, a pressure applied from the cathode member 51 and the anode member 52 to both the post electrode faces 23 and 3a should be considerably large.

The external force partly applied to the convex portion 21 and the external cathode electrode 20 acts between the external cathode electrode 20 and the cathode electrode 10K. However, the external force applied to a circumferential portion 22 of the external cathode electrode 20 doesn't act between the electrodes 20 and 10K but acts as a bending moment of the external cathode electrode 20 around a point S shown in FIG. 10. This is because there is no member for supporting the circumferential portion 22 from below, but merely an elastic force of the conical spring 42 acts upwards.

Figure 11:
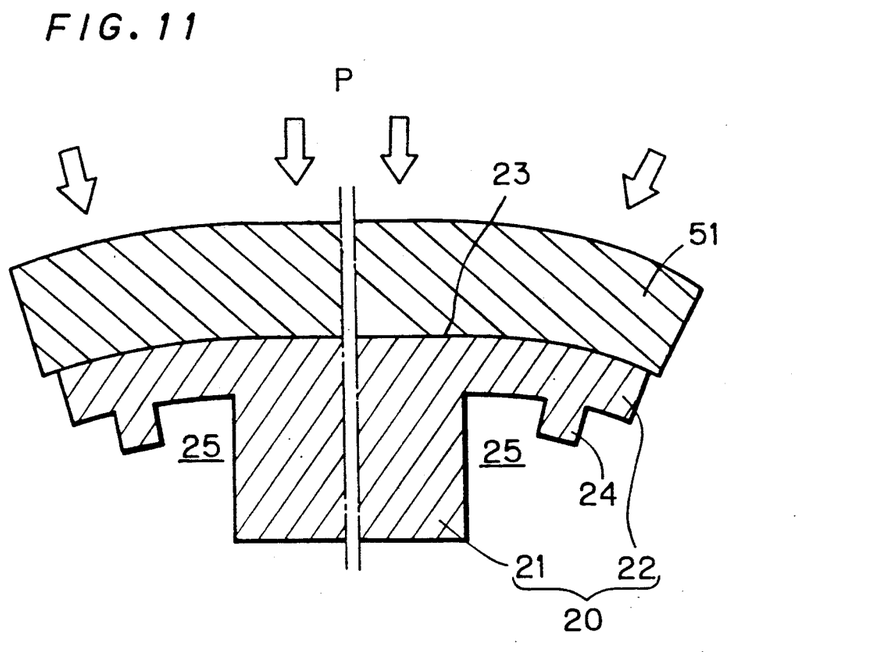
FIG. 11 is a diagram schematically showing the semiconductor device in FIG. 9 to which external force is applied.

Thus, as schematically shown in FIG. 11, the circumferential portion 22 of the external cathode electrode 20 is bent by an external force P applied from the cathode member 51 of the external equipment to the post electrode face 23. Accordingly, the shape of the groove 25 is deformed, and the pressure applied from the conical spring 42 (FIG. 10) held in the groove 25 to the gate conductor 13 is also changed. As a result, the pressure propagated from the gate conductor 13 to the semiconductor substrate 2 through the gate electrode 10G is changed, and there arises the disadvantage that a gate characteristic in the GTO 200 becomes unstable.

Additionally, the bending moment around the point S exerts effects on a stress distribution in the convex portion 21, and therefore, a spatial distribution of the pressure applied from the convex portion 21 to the cathode electrode 10K becomes uneven. Then, a contact resistance between the convex portion 21 and the cathode electrode 10K with the temperature compensating plate 11 intervening therebetween become spatially uneven, so that current is concentrated in an area having a small contact resistance. This causes the semiconductor element 1 to locally generate larger heat while the GTO 200 is turning on, and there arises a problem that a thermal breakdown of the semiconductor element 1 is easily caused.

SUMMARY OF THE INVENTION

The present invention is directed to a semiconductor device usable under the condition where an external force is applied thereto.

According to the present invention, the device comprises: (a) a semiconductor element having: (a-1) a semiconductor substrate having top and bottom major surfaces; (a-2) a first main electrode provided on a first region of the top major surface; (a-3) a control electrode provided on a second region of the top major surface, wherein the second region is separated from the first region in position; and (a-4) a second main electrode provided on the bottom major surface; (b) a first external main electrode member provided on the semiconductor element and comprising: (b-1) a bottom surface comprising a convex portion and a concave portion, wherein the convex portion is electrically in contact with the first main electrode and the concave portion is opposed to the control electrode across a gap; and (b-2) a top surface comprising a first area opposite to the convex portion and a second area at least a part of which is opposite to the concave portion, wherein a level of the first area is higher than a level of the second area; (c) control conductor inserted into the gap and pushed onto the control electrode by an elastic member provide between the control conductor and a concavity defined by the concave portion; and (d) a second external main electrode member provided on and electrically in contact with the second main electrode.

According to the present invention, in the semiconductor device, when external force is applied to the top surface of the first external main electrode member, the external force acts on the first area of the top surface but not on the second area, because the second area is lower in level than the first area. The second area is opposed to at least a part of the concave portion of the bottom surface of the first external main electrode member, and hence a bending moment is substantially prevented from developing to the convex portion. As a result, the convex portion is not deformed, and no pressure change is caused between the control conductor and the control electrode by the elastic force of the elastic member.

Furthermore, because the bending moment does not develop, a spatial uniformity of the pressure applied from the first area to the first main electrode in the semiconductor element can be maintained.

The present invention is also directed to an electrode block made of a conductive material and usable in a semiconductor device, wherein the semiconductor device comprises a semiconductor substrate having a major surface on which first and second electrode layers are provided separately and wherein the electrode block is so placed on the major surface as to be electrically in contact with the first electrode layer.

According to the present invention, the electrode block comprises: (a) a first surface having a convex portion and a concave portion whose respective positions on the first surface are so determined that the convex portion is electrically in contact with the first electrode layer and the concave portion is opposite to the second electrode layer across a gap when the electrode block is placed on the major surface of the semiconductor substrate; and (b) a second surface opposite to the first surface and having: (b-1) a first area opposite to the convex portion; and (b-2) a second area opposite to at least a part of the concave portion, wherein a level of the first area is higher than a level of the second area.

The electrode block according to the present invention has a surface configuration usable as "the first external main electrode" in the above-mentioned semiconductor device. Components of the electrode block, when incorporated in the semiconductor devices, act as previously mentioned.

Accordingly, it is an object of the present invention to provide a semiconductor device in which a control characteristic does not become unstable due to a deformation of an external main electrode, a uniformity of a contact resistance between an external electrode and a semiconductor element is attained and a thermal breakdown of the semiconductor element can be avoided.

It is another object of the present invention to provide an electrode block usable as an external main electrode in such a semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
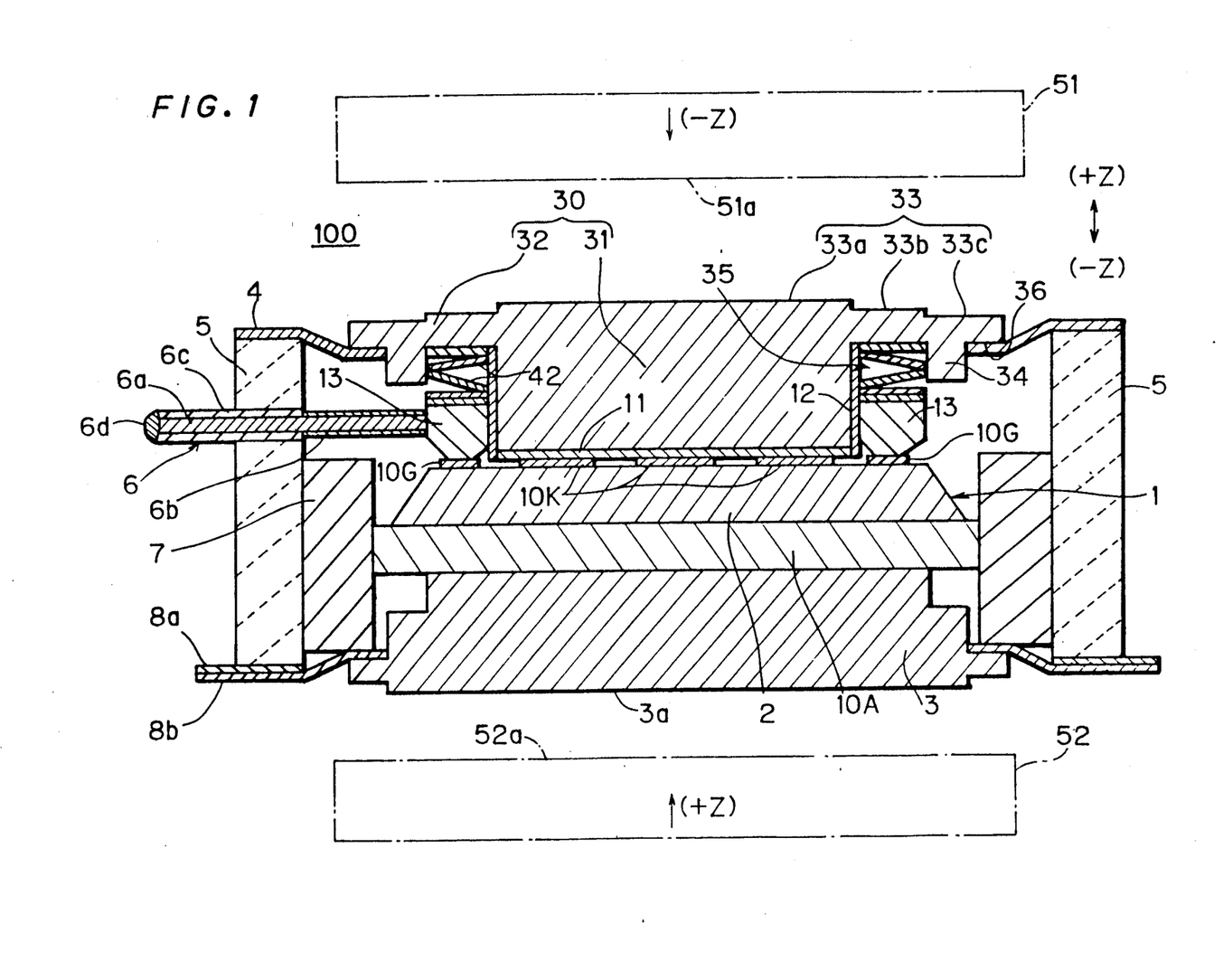
FIG. 1 is a sectional view showing a semiconductor device according to a preferred embodiment of the present invention.

FIG. 1 is a sectional view showing a GTO 100 according to a preferred embodiment of the present invention, where reference numerals are provided to corresponding components of the GTO 100 in FIG. 1 and the GTO 200 in FIG. 9. A component which is characteristic in the GTO 100 is an external cathode electrode 30, and details of the external cathode electrode 30 will be explained later.

The external cathode electrode 30 is an electrode block formed of copper, including a cylindrical convex portion 31 and an annular groove (concave portion) 35 surrounding the convex portion 31. As shown in an enlarged view of FIG. 2, one of inner walls of the groove 35 is defined by an insulating sheet 12 covering a side surface 31a of the convex portion 31, while the other inner wall is defined by a surface 34a of an annular wall 34. The wall 34 is formed as a unity together with a circumferential portion 32 contiguous to the convex portion 31.

Figure 2:
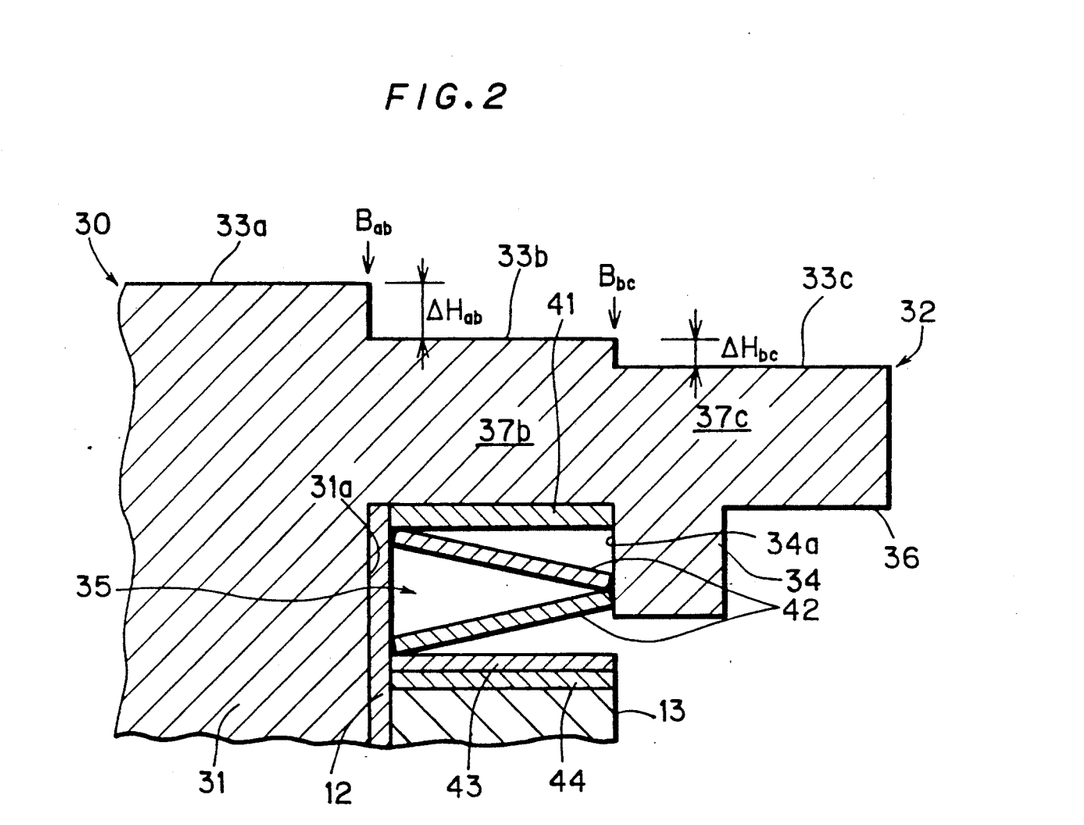
FIG. 2 is a partial enlarged view of the semiconductor device shown in FIG. 1.
Figure 3:
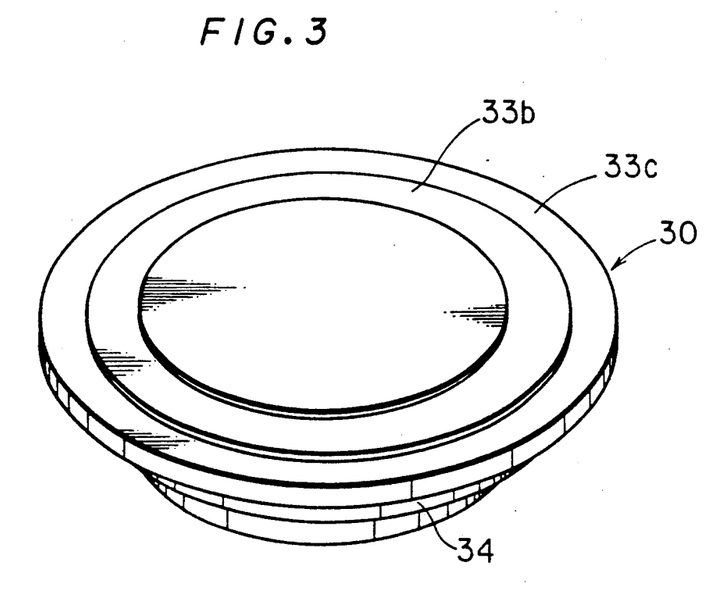
FIG. 3 is a perspective view showing an electrode block employed as an external cathode electrode in the embodiment.

An upper surface 33 of the external cathode electrode 30 has a 3-level step configuration. FIG. 2 shows an enlarged view of the step configuration, and FIG. 3 shows perspective view of the external cathode electrode 30. With the step configuration, a first area 33a in the center portion is the highest, a second area 33b surrounding the first area 33a is the second highest and a third area 33c in the outermost part is the lowest. Preferably, the difference $\Delta H_{ab}$ between the respective levels of the first and second areas 33a and 33b (FIG. 2) is approximately 0.1 mm, while the difference $\Delta H_{bc}$ between the respective levels of the second and third areas 33b and 33c is approximately 0.5 mm. The areas 33a to 33c have their respective flat top surfaces.

As will be understood from FIG. 1, the first area 33a is opposed to a convex portion 31, while the second area 33b is opposed to the groove 35. The third area 33c is opposed to the wall 34 and a lower surface portion 36 extending from the same. The boundary $B_{ab}$ between the first and second areas 33a and 33b (FIG. 2) is aligned with the side surface 31a of the convex portion 31, while the boundary $B_{bc}$ between the second and third areas 33b and 33c is aligned with the side surface 34a of the wall 34. Corresponding to a cylindrical shape of the convex portion 31 and an annular shape of each of the groove 35 and the wall 34, the first area 33a is circular in shape, and the second and third areas 33b and 33c are annular in shape. The external cathode electrode 30 can be obtained by cutting a cylindrical copper block.

The GTO 100, when mounted in an external equipment, is inserted between the cathode member 51 and the anode member 52 (FIG. 1) of the external equipment. Surfaces 51a, 52a of the members 51 and 52 are flat, and therefore the surface 51a of the cathode member 51 comes in contact only with the first area 33a. Thus, the first area 33a corresponds to a post electrode surface of the external cathode electrode 30. On the other hand, the bottom surface 3a of the external anode electrode 3 is not formed as such a 3-level step configuration, and the entire bottom surface 3a functions as a post electrode face.

Figure 4:
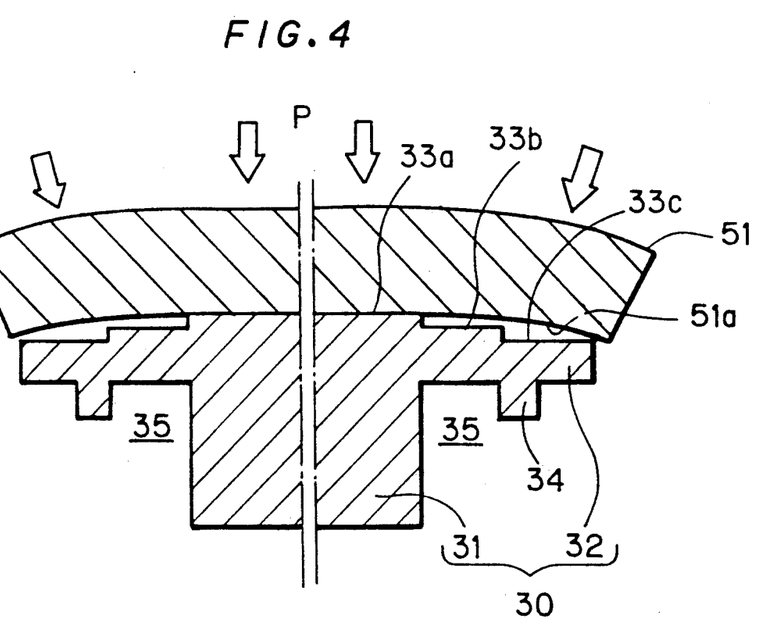
FIG. 4 is a diagram schematically showing the semiconductor device in FIG. 1 under the condition that an external force is applied thereto.

Similar to the prior art GTO 200 in FIG. 9, the GTO 100 is used with a large pressure applied through the members 51 and 52. At this time, as schematically shown in FIG. 4, the member 51 itself is deformed in its outer circumferential portion, but the deformation is never propagated to the groove 35, because the second and third areas 33b and 33c are not in contact with the member 51. Hence the urging force of the conical spring 42 to the gate conductor 13 in FIG. 2 is not changed, and a gate characteristic of the semiconductor element 1 keeps stable. A pressure distribution between the convex portion 31 and the cathode electrode 10K through the temperature compensating plate 11 is spatially uniform. Thus, a contact resistance in the interface between them is also spatially uniform, and the breakdown of the semiconductor element 1 is hardly caused by a generation of heat due to an uneven current distribution.

Thus, with the GTO 100 of the preferred embodiment, a configuration of the external cathode electrode 30 is improved so that the troubles caused in the conventional GTO 200 can be effectively avoided.

In the preferred embodiment in FIG. 1, the upper surface 33 of the external cathode electrode 30 is formed not as a 2-level step configuration but as the 3-level step configuration for the following reason: The lower the levels of the areas other than the first area 33a in the upper surface 33 of the external electrode 30 are, the better in order to prevent the cathode member 51 of the external equipment from coming into contact with the second area 33b. However, making the level of the second area 33b excessively low, the thickness of a region 37b (FIG. 2) between the groove 35 and the second area 33b considerably decreases. The region 37b is an important part to retain the strength and prevent the deformation around the groove 35, and hence, it is desirable to avoid excessive decrease in the thickness of the region 37b. For the purpose, preferably, the level of the second area 33b is not significantly low, and the level difference $\Delta H_{ab}$ should be the lower limit or around enough to prevent the member 51 from coming into contact with the second area 33b.

Below the third area 33c the groove 35 does not exist. Thus, it is possible that the third area 33c is lower in level than the second area 33b. Moreover, as shown in FIG. 4, since the member 51 is deformed more greatly as it is closer to its outer circumferential portion, it is especially effective for preventing the contact with the member 51 to make the third area 33c lower in level than the second area 33b.

For these reasons, the 3-level step configuration of the preferred embodiment especially suits for an aspect of the present invention.

Figure 5:
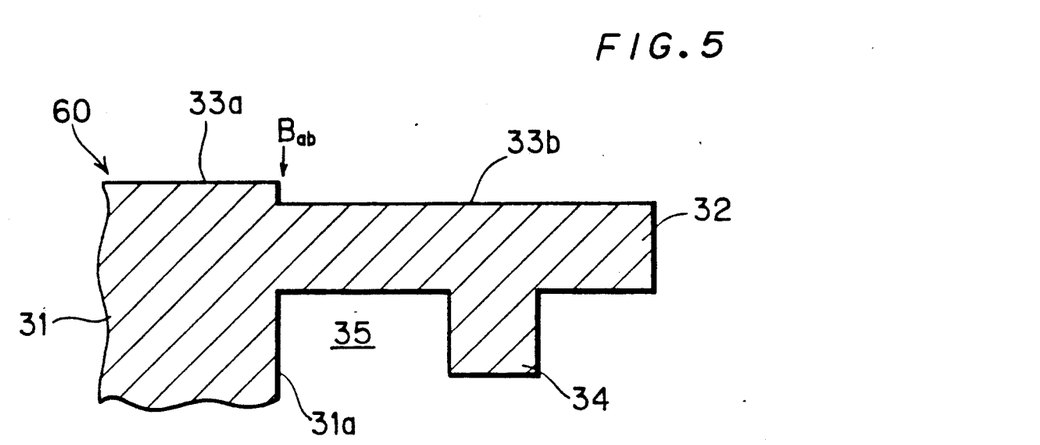
FIGS. 5 to 7 are partial enlarged sectional views showing other examples of the external cathode electrode.

Other preferred embodiments according to the present invention will be now described. An external cathode electrode 60 shown in a partial enlarged sectional view in FIG. 5 includes a circumferential portion 32 of which entire top surface corresponds to the second area 33b. When deformation of the cathode member 51 of the external equipment is relatively small, such a 2-level step configuration also makes it possible to prevent the circumferential portion 32 from coming into contact with the cathode member 51. Also, even if the cathode member 51 is in contact with the circumferential portion 32 in some part, this results in a very little bending moment being applied to the circumferential portion 32.

Figure 6:
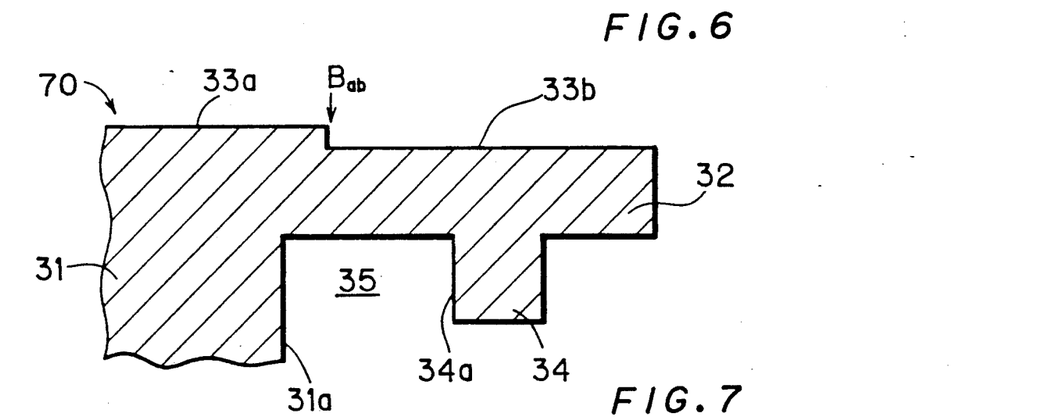

In an external cathode electrode 70 in FIG. 6, the boundary $B_{ab}$ between the first and second areas 33a and 33b is deviated from the position of the side face 31a of the convex portion 31, while the second area 33b is opposed to a part of the groove 35. With such a configuration, a bending moment to the groove 35 is caused, but the degree is smaller compared with the conventional external electrode 20 (FIG. 9). The boundary $B_{ab}$ is desirably aligned with the side face 31a, but the modification as shown in FIG. 6 is also in the scope of the present invention.

Figure 7:
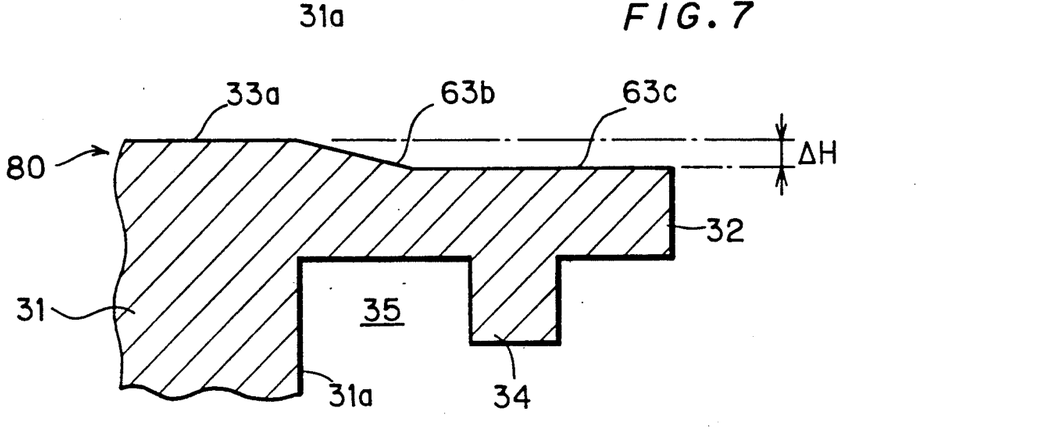

In an external cathode electrode 80 in FIG. 7, an area 63c lower than the first area 33a by a level difference ΔH lies around the first area 33a through a sloping face 63b. In external cathode electrodes according to the present invention, not only a step configuration but also a configuration including a slope are usable.

Figure 8:
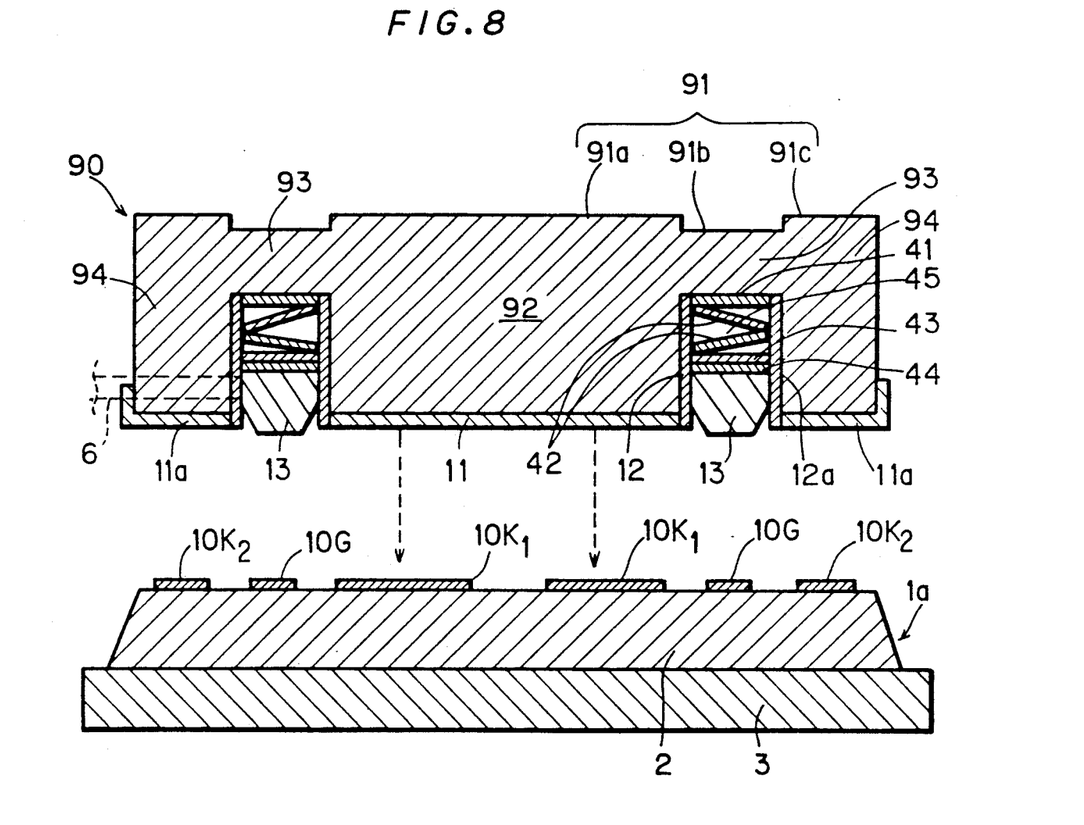
FIG. 8 is an exploded sectional view showing a part of the semiconductor device according to another preferred embodiment of the present invention.

FIG. 8 is a sectional view showing an external cathode electrode 90 of still another preferred embodiment. The external cathode electrode 90 is used as a combination with a semiconductor element 1a which is different in type from the semiconductor element 1 in FIG. 1. In the semiconductor element 1a, a cathode electrode 10K$_1$ is provided in the center portion of the top surface of a semiconductor substrate 2 and additionally another cathode electrode 10K$_2$ is provided on the outer side of the gate electrode 10G. Correspondingly, an external cathode electrode 90 is configured as a unity which includes a convex portion 92 in the center portion and an annular outer circumferential portion 94 connected by a connecting portion 93.

Below the connecting portion 93 an annular groove 45 is formed, and insulating sheets 12 and 12a are attached to inner walls of the groove 45. A conical spring 42 is held in the groove 45, and an annular gate conductor 43 is urged downwards by the conical spring 42. Onto the lower surface of an outer circumferential portion 94 a temperature compensating plate 11a is attached. Moreover, an external gate electrode 6 inserted in a notch (not shown) formed in a part of the outer circumferential portion 94 is brazed to the gate conductor 13. The lower surfaces of the convex portion 92 and circumferential portion 94 are positioned opposed to the cathode electrode 10K$_1$ and 10K$_2$ on the semiconductor substrate 2, while the lower surface of the gate conductor 13 is positioned opposed to the gate electrode 10G. The external cathode electrode 90 is mounted on the semiconductor element 1a as shown by an arrow of a broken line and comes into contact with the semiconductor element 1a by external force.

In the external cathode electrode 90 of this type, its upper surface 91 is formed as a step configuration composed of first to third areas 91a to 91c. The first area 91a is opposed to the convex portion 92, while the second area 91b is opposed to the groove 45. The third area 91c covers the top surface of the outer circumferential portion 94. The first and third areas 91a and 91c are at a same level, but the second area 91b is lower than them. Thus, in the external cathode electrode 90, since the outer circumferential portion 94 must be pressed against the cathode electrode 10K$_2$ to come into contact with it through the temperature compensating plate 11a, the third area 91c is shaped to be able to come into contact with the cathode members of the external equipment, but the second area 91b alone is not in contact with the cathode members.

As will be recognized, the present invention is applicable in various arrangements of the cathode electrode and the gate electrode on the semiconductor substrate. Moreover, the present invention can be applied not only to GTOs but to all semiconductor devices having their respective control electrodes, such as other thyristors, transistors, etc.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A pressure contact type semiconductor device, comprising:
   a semiconductor element which includes a semiconductor substrate having top and bottom major surfaces, a first main electrode provided on a first region of said top major surface, a control electrode provided on a second region of said top major surface, wherein said second region is spatially separate from said first region, and a second main electrode provided on said bottom major surface;
   a first external main electrode member provided above said semiconductor element which includes a bottom surface including an extended lower portion and a recessed upper portion, wherein said extended lower portion is electrically in contact with said first main electrode and said recessed upper portion is opposed to said control electrode across a gap, and
   a top surface including a first area opposite to said extended lower portion and a second area at least a part of which is opposite to said recessed upper portion, wherein a level of said first area is higher than a level of said second area;
   a control conductor inserted into said gap and pushed onto said control electrode by an elastic member provided between said control conductor and a cavity defined by said upper recessed portion; and
   a second external main electrode member provided on and electrically in contact with said second main electrode.

2. The semiconductor device of claim 1, wherein:
   a first boundary between said first area and said second area is aligned with a boundary between said lower extended portion and said upper recessed portion.

3. The semiconductor device of claim 2, wherein:
   said first area is a flat area located in a center position of said top surface of said first external main electrode member; and
   said second area is a flat area surrounding said first area.

4. The semiconductor device of claim 3, wherein:
   said top surface of said first external main electrode member includes a third area surrounding said second area and having a level lower than that of said second area.

5. The semiconductor device of claim 4, wherein
   said first area is a circular area; and
   said second and third areas are ring areas.

6. The semiconductor device of claim 1, wherein:
   said top surface includes a sloped area between said first and second areas.

7. An electrode block made of a conductive material and usable in a semiconductor device, wherein said semiconductor device includes a semiconductor substrate having a major surface on which are first and second spatially separate electrode layers and wherein said electrode block is placed on said major surface so that it is electrically in contact with said first electrode layer, said electrode block comprising:

(a) a lower first surface having an extended portion and a recessed portion whose respective positions on said first surface are so determined that said extended portion is electrically in contact with said first electrode layer and said recessed portion is opposite to said second electrode layer across a gap; and (b) an upper second surface opposite to said first surface which includes a first area opposite to said extended portion and a second area opposite to at least a part of said recessed portion, wherein a level of said first area is higher than a level of said second area.

8. The electrode block of claim 7, wherein
said first area is a flat area located in a center position of said second surface of said electrode block; and
said second area is a flat area surrounding said first area.

9. The electrode block of claim 8, wherein:
said second surface of said electrode block includes a third area surrounding said second area and having a level lower that that of said second area.

10. The electrode block of claim 9, wherein
said first area is a circular area; and
said second and third areas are ring areas.

11. The electrode block of claim 7, wherein:
said second surface includes a sloped area between said first and second areas.

12. A pressure contact type semiconductor device, which comprises:

a semiconductor element including a thin and essentially flat semiconductor having top and bottom major surface, a first main electrode provided on a first region of said top major surface, a control electrode provided upon a spatially separate region of said top major surface, said spatially separate region is separate from the first region, and a second main electrode provided on the bottom major surface;

a first external main electrode member provided above said semiconductor element whose lower surfaces include a flat lower surface above and opposed to the first main electrode and a recessed lower surface forming a recess in said first external main electrode member, said recessed lower surface above, opposed to, and separated by said recess from said control electrode, a first upper surface directly above a region of said flat lower surface, and at least one second upper surface which is lower than said first upper surface and has a portion directly above said recessed lower surface;

a second external main electrode member provided on and electrically in contact with said second main electrode;

a control conductor in said recess;

an elastic member means, between said recessed lower surface and said control conductor, for pressing said control conductor against said control electrode.

* * * * *